United States Patent [19]
Tobita

[11] Patent Number: 4,980,799
[45] Date of Patent: Dec. 25, 1990

[54] ELECTROSTATIC CAPACITY DEVICE IN SEMICONDUCTOR MEMORY DEVICE, AND APPARATUS FOR AND METHOD OF DRIVING SENSE AMPLIFIER USING ELECTROSTATIC CAPACITY DEVICE

[75] Inventor: Youichi Tobita, Hyogo, Japan
[73] Assignee: Mitsubishi Denki Kabushiki Kaisha, Tokyo, Japan
[21] Appl. No.: 459,998
[22] Filed: Jan. 4, 1990
[30] Foreign Application Priority Data

Jan. 18, 1989 [JP] Japan .................................. 1-9039
Apr. 10, 1989 [JP] Japan .................................. 1-91021

[51] Int. Cl.⁵ .................... H01G 4/06; G11C 11/40; H01L 27/04
[52] U.S. Cl. .................................. 361/311; 307/530; 29/25.03; 365/182
[58] Field of Search .................................. 361/311–313; 29/571; 357/51, 65, 22, 23.6, 45, 71; 365/144, 149, 189, 158, 174, 182, 189.05, 193, 203, 205, 207, 210, 226; 307/362, 530

[56] References Cited

U.S. PATENT DOCUMENTS

| | | | |
|---|---|---|---|
| 4,348,746 | 9/1982 | Okabayashi et al. | 365/182 |
| 4,658,158 | 4/1987 | Chau et al. | 307/530 |
| 4,777,625 | 10/1988 | Sakui et al. | 365/207 |

OTHER PUBLICATIONS

"32K×8 bits fast SRAM; 10 ns accomplished with thorough countermeasures against noise" Nikkei Electronics, No. 455, 1988, Sep. 5., pp. 133-136.

Primary Examiner—Donald A. Griffin
Attorney, Agent, or Firm—Lowe, Price, Leblanc, Becker & Shur

[57] ABSTRACT

An apparatus (50) activates and drives sense amplifiers in a dynamic random access memory (DRAM) at a high speed. The sense amplifier includes a P-MOS sense amplifier (15, 16) and an n-MOS sense amplifier (18, 19). The P-MOS sense amplifier is connected to a power line (31) through a first switching element (22) to be activated while the n-MOS sense amplifier is connected to a ground line (30) through a second switching element (20) to be activated. The sense amplifier driving apparatus includes a capacitor (34) conneced between the power line and the ground line. This enables compensation for the charge and discharge currents which flow in the bit line charging and discharging operations, reduction in the bit line charging and discharging times, and suppression of the fluctuation in supply potential, improving the operating speed of the DRAM. This capacitor (34) has an electrode and a dielectric which are made of the same materials with those of a memory cell capacitor (6) comprised in a memory cell, and the dielectric is formed to be of the same film thickness also as that of the memory cell capacitor. The memory cell has a stack-type structure, where the capacitor comprises at least two capacitance elements connected in series.

9 Claims, 13 Drawing Sheets

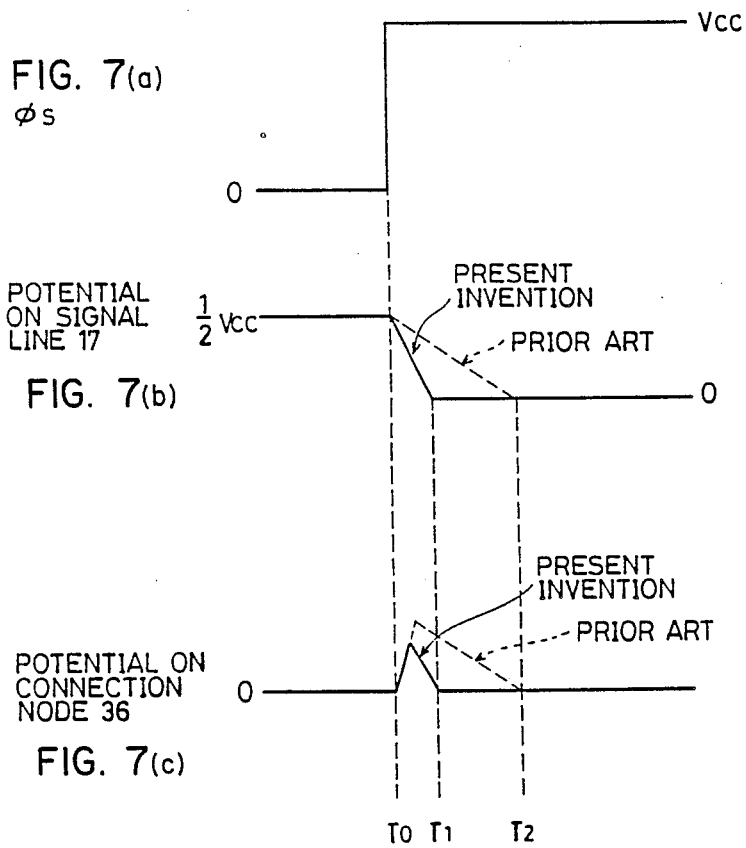

MEMORY CELL | CAPACITOR

ELECTROSTATIC CAPACITY DEVICE IN SEMICONDUCTOR MEMORY DEVICE, AND APPARATUS FOR AND METHOD OF DRIVING SENSE AMPLIFIER USING ELECTROSTATIC CAPACITY DEVICE

BACKGROUND OF THE INVENTION

1. Field of the Invention

The present invention generally relates to semiconductor memory devices, and more particularly, to improvements of an electrostatic capacity device in a semiconductor memory device. More specifically, the present invention relates to a structure for providing a fast sensing operation in which a read-out potential appearing on a bit line in selecting a word line is detected and amplified, with the use of the improved electrostatic capacity device.

2. Description of the Background Art

FIG. 1 is a diagram exemplifying a schematic structure of an entire read-out portion in a conventional dynamic random access memory. Referring to FIG. 1, the dynamic random access memory comprises a memory cell array MA constituted of memory cells arranged in a matrix of rows and columns and each storing information, an address buffer AB responsive to an externally applied external address for generating an internal address, an X decoder ADX for decoding an internal row address received from the address buffer AB for selecting a corresponding row in the memory cell array MA, and a Y decoder ADY for decoding an internal column address received from the address buffer AB for selecting a column corresponding thereto in the memory cell array MA.

The address buffer AB receives a row address specifying a row in the memory, cell array MA and a column address specifying a column in the memory cell array MA in a time division multiplexing manner and generates the internal row address and the internal column address at predetermined timings to apply them to the X decoder ADX and to the Y decoder ADY, respectively.

To read out data in a memory cell specified by the external address, the dynamic random access memory further comprises a sense amplifier for detecting and amplifying data in the memory cells connected to a row selected by a decoded row address signal from the X decoder ADX, an input/output interface (I/O) responsive to a decoded column address signal from the Y decoder ADY for transmitting data of a selected memory cell among the memory cells connected to the selected single row, and connected to the corresponding column, to an output buffer OB, and the output buffer OB for transmitting the memory cell data received through the input/output interface (I/O), to a device external to the dynamic random access memory. In FIG. 1, there are shown the sense amplifier and the input/output interface (I/O) as constituting a single block SI. The output buffer OB receives the read-out data transmitted from the block SI and converts the same into corresponding output data Dout for output.

Peripheral circuitry CG for generation of control signals is provided to generate the control signals for controlling various operating timings of the dynamic random access memory. The peripheral circuitry CG for generation of control signals generates a precharge potential $V_B$, a word line drive signal Rn, an equalize signal $\phi_E$, a precharge signal $\phi_P$, a sense amplifier activating signal $\phi_S$ and the like, as will be described later in detail.

A schematic structure of the memory cell array shown in FIG. 1 and other circuit associated therewith is shown in FIG. 2. Referring to FIG. 2, the memory cell array MA comprises word lines WL1, WL2, ... and WLn each defining a single row of the memory cell array MA, and bit line pairs BL0 and $\overline{BL0}$, BL1 and $\overline{BL1}$, ... and BLm and $\overline{BLm}$ each having connected memory cells for a single column of the memory cell array MA.

The bit line BL0 and $\overline{BL0}$, ... BLm and $\overline{BLm}$ each constitute a folded bit line, every two bit lines of which constitute a single bit line pair. More specifically, the bit lines BL0 and $\overline{BL0}$ constitute one bit line pair, the bit lines BL1 and $\overline{BL1}$ constitute another bit line pair and so forth, until the bit lines BLm and $\overline{BLm}$ constitute a bit line pair.

Memory cells 1 for storing information are provided at intersections of each of the bit lines BL0, ... BLm and $\overline{BLm}$, and alternate word lines. Therefore, for respective bit line pairs, the memory cell 1 is provided at an intersection of a single word line and either bit line of a single bit line pair. The respective bit line pairs BL0 and $\overline{BL0}$, ... BLm and $\overline{BLm}$ are provided with a precharge/equalize circuit 150 for equalizing and precharging potentials on the respective bit lines to a predetermined potential $V_B$ while the dynamic random access memory is in its stand-by state.

The respective bit line pairs BL0 and $\overline{BL0}$, ..., BLm and $\overline{BLm}$ are further provided with a sense amplifier 50 for sensing and amplifying data of the selected memory cell. The sense amplifier 50 is responsive to a first sense amplifier drive signal $\phi_A$ and a second sense amplifier drive signal $\phi_B$ transmitted through a first signal line 14 and a second signal line 17, respectively, for being activated to detect and differentially amplify potential difference on the corresponding bit line pair.

In order to transmit the data of the selected memory cell to the output buffer OB as shown in FIG. 1, the bit line pairs BL0 and $\overline{BL0}$, ..., BLm and $\overline{BLm}$ are further provided with transfer gates T0 and T0', T1 and T1', ... and Tm and Tm', respectively, which are responsive to the decoded column address signal from the Y decoder ADY for turning on to connect the corresponding bit line pair with data input/output buses I/O and $\overline{I}/$. The transfer gates T0 and T0, are provided for the bit lines BL0 and $\overline{BL0}$, the transfer gates T1 and T1' for the bit lines BL1 and $\overline{BL1}$, and the transfer gates Tm and Tm' for the bit line pairs BLm and $\overline{BLm}$. A single transfer gate pair turns on in response to the decoded column address signal from the Y decoder ADY thereby connecting the corresponding bit line pair to the input/output buses I/O and $\overline{I}/$.

FIG. 3 is a diagram showing a circuit structure associated with a single bit line pair out of the structure shown in FIG. 2. In particular, the diagram shows a specific structure of an apparatus for driving the sense amplifier 50.

Referring to FIG. 3, the memory cell 1 comprises a memory capacitor 6 for storing information in the form of charge, and a selection transistor 5 which is responsive to the word line drive signal Rn transmitted onto a word line 3 for turning on to connect the memory capacitor 6 to a bit line 2. The selection transistor 5 comprises an n-channel insulating gate field effect transistor (referred to simply as n-FET hereinafter) having the gate connected to the word line 3 and the source connected to the bit line 2. One electrode of the memory capacitor 6 is connected to the drain of &he selection transistor 5 through a storage node 4 while the other electrode is connected to ground potential GND (practically to a supply potential Vcc).

The precharge/equalize circuit 150 comprises n-FETs 9, 10 and 12. The n-FET 9 is responsive to the precharge signal $\phi_P$ transmitted through a precharge signal transmitting line 11, for turning on to transmit the precharge voltage $V_B$ transmitted through a precharge potential transmitting signal line 8 onto the bit line 2. The n-FET 10 is responsive to the precharge signal $\phi_P$ transmitted through the signal line 11, for turning on to transmit the precharge voltage $V_B$ transmitted through the signal line 8 to another bit line 7. The n-FET 12 is responsive to the equalize signal $\phi_E$ transmitted through an equalize signal transmitting signal line 13, for turning on to electrically short-circuit the bit lines 2 and 7 thereby equalizing the potentials on the bit lines 2 and 7.

The sense amplifier 50 comprises p-channel insulating gate field effect transistors (referred to simply as p-FETs hereinafter) 15 and 16, and n-FETs 18 and 19. The sense amplifier 50 comprises a flip-flop of a CMOS (Complimentary Metal Oxide Semiconductor) structure where one electrode of each of the p-FETs 15 and 16 is cross-coupled with the gate electrode of the other, and also one electrode of each of the n-FETs 18 and 10 is cross-coupled with the gate electrode of the other. A connection node between one electrode of the p-FET 15 and one electrode of the n-FET 18 is connected to the bit line 2 while another connection node between one electrode of the p-FET16 and one electrode of the n-FET 19 is connected to the bit line 7. The other electrodes of the p-FETs 15 and 16 are connected together to a signal line 14 which transmits the first sense amplifier drive signal $\phi_A$. The other electrodes of the n-FETs 18 and 19 are connected together to a signal line 17 which transmits the second sense amplifier drive signal $\phi_B$.

Between the signal lines 14 and 17 there are provided n-FETs 26, 27 and 28 for precharging and equalizing potentials on the signal lines 14 and 17 to the predetermined potential $V_B$. The n-FET26 is responsive to the precharge signal $\phi_P$ transmitted through the signal line 11 for turning on to transmit the predetermined constant precharge voltage $V_B$ transmitted through the signal line 8 onto the signal line 14. The n-FET 27 is responsive to the precharge signal $\phi_P$ transmitted through the signal line 11 for turning on to transmit the precharge potential $V_B$ transmitted through the signal line 8 onto the signal line 17. The n-FET 28 is responsive to the precharge signal $\phi_P$ transmitted through the signal line 11 for turning on to electrically short-circuit the signal lines 14 and 17 thereby equalizing the potentials on the signal lines 14 and 17.

In order to drive the sense amplifier 50, between the signal line 14 and a first source potential supply terminal 24 there is provided a p-FET 22 which is responsive to the first sense amplifier activating signal $\overline{\phi_S}$ for turning on to connect the signal line 14 to a first power line 31.

Similarly, between the signal line 17 and a second source potential supply terminal 29 there is provided an n-FET 25 which is responsive to the second sense amplifier activating signal $\phi_S$ for turning on to connect the signal line 17 to a second power line 30. The sense amplifier activating signals $\phi_S$ and $\overline{\phi_S}$ are applied to the gates of the p-FET 22 and the n-FET 25 through signal input terminals 23 and 26, respectively. The supply terminals 24 and 29 are made of bonding pads which have been formed in a peripheral area of a semiconductor chip having the dynamic random access memory formed therein, so as to receive a predetermined potential from an external to the dynamic random access memory.

The bit line 2 has a parasitic capacitance 20 and the bit line 7 has a parasitic capacitance 21. In addition, the second power line 30 has a parasitic resistance 32.

Meanwhile, for simplicity of the drawing, in FIG. 3 there are typically shown only one word line 3 and the memory cell 1 disposed at the intersection between the word line 3 and the bit line 2. In practice, however, a plurality of memory cells are connected to each of the bit lines 2 and 7.

Furthermore, the precharge voltage $V_B$ for precharging the bit lines 2 and 7 and the signal lines 14 and 17 to a predetermined potential is generally set to about a half of the operational supply potential Vcc.

FIG. 4 is a signal waveform diagram showing operation of the circuit structure shown in FIG. 3. In FIG. 4, an operation is shown where information of logic "1" which has bee stored in the memory cell 1 shown in FIG. 3 is read out. In the following, the reading-out operation for the memory cell data will be described with reference to FIGS. 3 and 4.

In a stand-by state between the time t0 and the time t1, the precharge signal $\phi_P$ and the equalize signal $\phi_E$ are both at the "H" level. Therefore, all of the n-FETs 9, 10 and 12, and the n-FETs 26, 27 and 28 are in their on-state to hold the bit lines 2 and 7 and the signal lines 14 and 17 at the predetermined precharge potential $V_B$ (=Vcc/2).

At the beginning of a memory cycle or at the time t1 whereat the stand-by state terminates, the precharge signal $\phi_P$ and the equalize signal $\phi_E$ begin to fall to the "L" level. This causes the n-FETs 9, 10, 12, 26, 27 and 28 to be turned off.

At the time t2, the precharge signal $\phi_P$ and the equalize signal $\phi_E$ reach the "L" level, turning off all of the n-FETs 9, 10, 12, 26, 27 and 28, and then the internal row address is applied from the address buffer AB to the X decoder ADX as shown in FIG. 1, to select a row in the memory cell array MA.

At the time t3, the word line drive signal Rn is transmitted onto a selected word line 3 (assuming that the word line 3 shown in FIG. 3 is selected) to raise potential on the word line 3. This causes the selection transistor 5 in the memory cell 1 to be turned on so that the capacitor 6 in the memory cell 1 is connected to the bit line 2. As a result, charges having been stored at the storage node 4 move to the bit line 2, increasing potential on the bit line 2 by only $\Delta V$. The value V of this potential increase on the bit line 2 is determined depending on capacitance value C6 of the memory capacitor 6, capacitance value C20 of the parasitic capacitance 20 of the bit line 2 and the stored voltage V4 at the storage node 4, which generally amounts to 100 to 200 mV.

At the time t4, the sense amplifier activating signal $\phi_S$ begins to rise while the sense amplifier activating signal $\overline{\phi_S}$ begins to fall, so that the n-FET 25 and the p-FET 22 are turned on. As a result, the first and second signal lines 14 and 17 are connected to the first and second power lines 31 and 30, respectively, causing the potential on the first signal line 14 to rise and the potential on the second signal line 17 to fall.

The rise and fall of potential on these first and second signal lines 14 and 17 activates the flip-flop circuit (sense amplifier 50) comprising the p-FETs 15 and 16 and the n-FETs 18 and 19, allowing the sensing operation for memory cell data to begin, followed by differential amplification of the minute potential difference $\Delta V$ between the bit lines 2 and 7. Meanwhile, since to the bit line 7 is connected no selected memory cell, potential on the bit line 7 remains held at the precharge level of Vcc/2 until the time t4.

In this sensing operation, when the n-FET 19 is turned on as a result of the potential increase on the bit line 2 only by $\Delta V$, with the potential on the second signal line 17 decreased, the charges having been stored in the parasitic capacitance 21 are discharged through the n-FET 19 to the signal line 17, so that potential on the bit line 7 substantially reaches 0 V at the time t5.

On the other hand, the potential decrease on the bit line 7 causes the p-FET 15 to be turned on, through which potential on the first signal line 14 is transmitted to the bit line 2 so that potential on the bit line 2 increases to the Vcc level. The potential on the bit line 2 is transmitted to the storage node 4 through the selection transistor 5 so that potential level at the storage node 4 becomes Vcc-$V_{TH}$, allowing restoring of data in the memory cell 1. $V_{TH}$ represents here threshold voltage of the selection transistor.

When the amplifying operation of the signal potentials on the bit lines 2 and 7 is accomplished by establishing the respective potentials at the supply potential Vcc level and at the ground potential GND level, one column of the memory cell array is selected according to the decoded address signal from the column decoder ADY (see FIG. 1) and the bit lines 2 and 7 are connected to the data input/output buses I/O and $\bar{I}/$ (see FIG. 2) until the time t8, whereby the information of the memory cell 1 is read out.

The aforementioned is a description for the operations of reading-out, amplifying and restoring data in a memory cell. When a series of these operations is accomplished, the circuit enters in its stand-by state for the subsequent memory cycle. More specifically, the word line drive signal Rn begins to fall at the time t8 and reaches the ground potential level of "L" at the time t9, and then the selection transistor 5 is turned off, electrically disconnecting the memory cell 1 from the bit line 2 to put the circuit in the stand-by state.

At the time t10, the sense amplifier activating signals $\phi_S$ and $\bar{\phi}_S$ begin to fall and rise, and at the time t11 reach the low level of ground potential GND and the high level of supply voltage Vcc, respectively, turning off the p-FET 22 and the n-FET 25 so that the sense amplifier 50 is inactivated.

At the time t12, the equalize signal $\phi_E$ begins to rise, turning on the n-FET 12 so that the bit lines 2 and 7 are electrically connected to each other. As a result, charges move from the bit line 2 at a higher potential level to the bit line 7 at a lower potential level and the potentials on the bit lines 2 and 7 together reach the precharge potential $V_B$ (=Vcc/2) approximately at the time t13. At the same time, transfer of charges occurs between the first and second signal lines 14 and 17 which have been put in the high-impedance state due to the p-FET 22 and n-FET 25 in the off-state, and the bit lines 2 and 7, resulting in potential levels of the signal lines 14 and 17 at Vcc/2+$|V_{TP}|$ and Vcc/2-$V_{TN}$, respectively. $V_{TP}$ represents here threshold voltage of the p-FETs 22 and 16 while $V_{TN}$ represents threshold voltage of the n-FETs 18 and 19.

When the precharge signal $\phi_P$ begins to rise at the time t14, the n-FETs 9, 10, 26, 27 and 28 begin to become conductive. When the precharge signal $\phi_P$ attains the supply voltage Vcc of "H" level at the time t15, all of the n-FETs 9, 10, 22, 26, 27 and 28 are turned on so that the precharge voltage $V_B$ is transmitted to the bit lines 2 and 7 and the signal lines 14 and 17 are electrically connected through the n-FET 28, whereby the two sets of potentials are equalized, respectively. Furthermore, the predetermined precharge voltage $V_B$ is transmitted to the signal lines 14 and 17 through the n-FETs 26 and 27 so that the potentials on the first and second signal lines 14 and 17 become Vcc/2. This transit of the precharge signal $\phi_P$ to the "H" level stabilizes potentials on the bit lines 2 and 7 and the signal lines 14 and 17 in preparation for the subsequent reading-out operation.

As described above, in the reading-out operation of memory cell data in the dynamic random access memory, one bit line of one bit line pair is charged from the Vcc/2+$\Delta V$ level to the Vcc level while the other bit line is discharged from the Vcc/2 level to the ground potential of 0 V level (only where logic "1" has been stored in the memory cell). In a case wherein logic "0" has been stored in the selected memory cell, potential of one bit line is discharged from the Vcc/2-$\Delta V$ level to the ground potential of 0 V level while the other bit line is charged from the Vcc/2 level to the supply potential of Vcc level.

In other words, in the operation of the sense amplifier, one bit line at a higher potential is charged to the supply voltage Vcc level while the other bit line at a lower potential is discharged to the ground potential level with respect to one bit line pair. This charge and discharge is attained by charging and discharging the capacitors of the bit lines, which is performed between the supply potential terminal 24 and the ground terminal (second supply potential terminal) 29 through the sense amplifier, the first and second signal lines 14 and 17 and the first and second power lines 30 and 31. However, the first and second power lines 31 and 30 are provided with the parasitic resistances 33 and 32 as described above (in the following description, the first power line 31 is referred to simply as power line and the second power line 30 as ground line for convenience of description). The parasitic resistances of the power line 31 and the ground line 30 will be described with reference to FIG. 5.

In FIG. 5, there is shown a schematic layout of a memory cell array, a sense amplifier, a power line 31 and a ground line 30 of a 4 M (mega) bit dynamic random access memory formed on a semiconductor chip 100.

In FIG. 5, the memory cell array MA is divided into 8 sub array blocks MA1 to MA8. Each of the sub arrays MA1 to MA8 has 512K bits, or memory cells arranged in 512 rows and 1024 columns (1K columns). The division of the memory cell array into the sub arrays allows bit lines in the respective sub array blocks to be reduced in length, and the read-out voltage $\Delta V$ for the memory cell to be increased. The sub array blocks MA1 to MA8 are provided with the sense amplifier blocks SA1 to SA8, respectively. In the respective sense amplifier blocks SA1 to SA8, since a single sense amplifier is provided for each of the columns in the corresponding sub array block, 1024 sense amplifiers are provided in total.

The ground line 31 extends from a bonding pad 24 to be disposed along and commonly for all of the sub array blocks MA1 to MA8 on the semiconductor chip 100. Likewise, the ground line 30 extends from a pad 29 for the ground potential to be disposed along and commonly for the memory cell array blocks MA1 to MA8 on the semiconductor chip 100. The power line 31 and the ground line 30 are disposed not only for the memory cell array blocks MA1 to MA8, but of course for supplying other peripheral circuits with a predetermined potential. For example, in the vicinity of the bonding pads 24 and 29, each of the power line 31 and the ground line 30 branches to be used for other peripheral circuits such as an address decoder, an address buffer or the like. To avoid complexity of description, here is shown only a structure where supply/ground potential is supplied to those circuit blocks which are associated with the memory cell array blocks MA1 to MA8.

A p-FET 221 and an n-FET 251 are provided to drive the sense amplifiers of the sense amplifier block SA1. Likewise, a p-FET 222 and an n-FET 252 are provided to drive the sense amplifier of the sense amplifier block SA2. For the sense amplifier block SA3, a p-FET 223 and an n-FET 253 are provided, for the sense amplifier block SA7 a p-FET 227 and an n-FET 257, and for the sense amplifier block SA8, a p-FET 228 and an n-FET 258 are provided.

The p-FETs 221 to 228 are responsive to the sense amplifier activating signal $\bar{\phi}_S$ applied from a signal input node 23, for turning on to connect the sense amplifier activating signal lines in the respective blocks to the ground line 31. The respective n-FETs 251 to 258 are responsive to the sense amplifier activating signal $\phi_S$ transmitted through a signal input node 26, for turning on to connect a signal line in the corresponding sense amplifier block to the ground line 30. The power line 31 and the ground line 30 have parasitic resistance as indicated by broken lines in FIG. 5.

As exemplified in FIG. 5, the power line 31 and the ground lines 30 are disposed substantially from one end of the semiconductor chip 100 to the other. Therefore, the parasitic resistance will be relatively great even if aluminum of low resistivity is employed as the interconnection material. In the structure shown in FIG. 5, for example, the largest possible parasitic resistance of the ground line 30 can be seen with respect to the sense amplifier block SA1 which has been provided furthest away from the pad 29. It is here attempted to calculate the parasitic resistance value of the ground line 30 with respect to this sense amplifier block SA1 in a general 4 M dynamic random access memory as an example. Now, assume that:

aluminum resistance value: 50 mΩ/□,
aluminum interconnection width: 25 μm,
aluminum interconnection length: 15 mm.

With the values above, the parasitic ground line 30 with respect to the sense amplifier block SA1 is given by the following expression.

$$R = 50 \times 10^{-3} \times 15 \times 10^{-3}/25 \times 10^{-6} \quad (1)$$
$$= 30 \, (\Omega)$$

Meanwhile, there are provided memory cells of 1024 columns in the memory cell array MA1, where a single column corresponds to a single bit line pair. This means that there are 1024 discharging bit lines in the sensing operation. Now, assuming that the capacitance per single bit line is about 0.3 pF, the total capacitance of the bit lines participating in the discharging is given by the following expression.

$$C = 0.3 \times 1024 \quad (2)$$
$$\approx 300 \, (pF)$$

The charges stored in this capacitance C are to be discharged to the ground terminal pad 29 through the n-FET 251 and the parasitic resistance of the ground line 30 in the sensing operation. Then, the time required for this discharging will be calculated. In order to simplify this calculation, it is assumed that size of the n-FET 250 is enlarged enough to have an equivalent resistance which is well smaller than the parasitic resistance of the ground line 30, and the discharge time t is regarded as time constant $\tau$ of this CR discharge circuit. The discharge time t is given by the following expression.

$$t = \tau = R \cdot C$$
$$= 30 \times 300$$
$$= 9 \, (ns)$$

The total delay time acceptable in a single memory cycle of the dynamic random access memory is 60 to 80 ns and more than 10% thereof is taken by the discharge time, which amounts to a relatively high proportion.

Furthermore, the above dynamic random access memory is constituted in such a manner that in one memory operation (one memory cycle), not only a single sub array block but also other sub array, blocks operate (in the 4 M bit dynamic random access memory shown in FIG. 5, two sub array blocks operate simultaneously). Therefore, in the sensing operation these plurality of sub array blocks are simultaneously activated so that the discharge in the sensing operation will cause the potential level on the ground line 30 and thus the discharge level of the bit line to increase, resulting in a longer discharge time than the above-mentioned value.

Furthermore, while in the above, description has been made merely on the delay in the discharge operation of the bit line at a lower potential in the sensing operation, the same argument is true of the charge operation for charging the bit line at a higher potential so that also the charge time becomes longer.

The increased time for charging and discharging the bit lines in the sensing operation also leads to an unnecessarily increased time which will be taken for establishing the potentials of the bit lines to the supply potential $V_{cc}$ level and the ground potential level, so that a problem arises that the memory cell data cannot be read out at a high speed.

Additionally, in a case where numerous bit lines are charged and discharged in the sensing operation as described above, the charging and the discharging currents in a large-capacity dynamic random access memory amount to, for example, as much as 150 mA to 250 mA, causing fluctuation in the supply potential and the ground potential, which may even result in a malfunction of the circuit operation.

The stabilization of supply voltage by providing a bypass condenser formed of a PN junction between the power line and, the ground line is described in "32K × 8 bits fast SRAM; 10 ns accomplished with thorough countermeasures against noise" Nikkei Electronics, No. 455, 1988, September 5, pp. 133 to 136.

SUMMARY OF THE INVENTION

An object of the present invention is to provide a sense amplifier driving apparatus which can eliminate the problems of a conventional dynamic random access memory as described above and perform charging and discharging of the bit lines at a high speed in the sensing operation.

Another object of the present invention is to provide a sense amplifier driving apparatus which is provided with an electrostatic capacitor superior in the high-frequency characteristic and capable of fully suppressing the fluctuation of supply potential and ground potential in the sensing operation.

Still another object of the present invention is to provide an electrostatic capacitor for use in a dynamic random access memory which is superior in the high-frequency characteristic and has a low parasitic resistance and a great capacitance value.

Further object of the present invention is to provide a sense amplifier driving method with which bit lines can be charged and discharged at a high speed in the sensing operation.

The sense amplifier driving apparatus in a semiconductor memory device according to the present invention comprises first and second sense amplifier driving signal transmitting signal lines, first and second source potential supplying signal lines, a first switching element responsive to a first sense amplifier activating signal for connecting the first sense amplifier driving signal transmitting signal line with the first source potential supplying signal line, a second switching element responsive to a second sense amplifier activating signal for connecting the second sense amplifier driving signal transmitting signal line with the second source potential supplying line, and a capacitor connected between the first and the second source potential supplying lines.

A memory cell, or a basic constituent unit of a semiconductor memory device comprises one field effect transistor and one capacitor. The capacitor provided between the power line and the ground line as mentioned above has an electrode and a dielectric made of the same materials as for those of the memory cell capacitor. The dielectrics of both capacitors also have the same film thickness.

The capacitor provided between the first and second source potential supply lines to be used in the sense amplifier driving apparatus above reduces impedance of the first and second source potential supply lines, thereby decreasing the time required for charging and discharging of the bit lines and allowing fast charging and discharging in the sensing operation.

Furthermore, for the memory cell capacitor, such a structure is adopted as will allow capacitance value and parasitic resistance value per unit area to become maximum and minimum, respectively, in a memory chip so that sufficient information charges can be stored with a smallest possible occupied area. Accordingly, the capacitor which has the electrode made of the same material and the dielectric also made of the same material to be of the same film thickness as those of this memory cell capacitor has a low parasitic resistance and a maximum capacitance value, which enables formation of a DC stabilizing capacitor with an excellent high-frequency characteristic and a small occupied area on a memory chip.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a waveform diagram showing an operation of the sense amplifier driving apparatus shown in FIG. 6, where the bit lines are discharged.

DESCRIPTION OF THE PREFERRED EMBODIMENTS

Figure 1:
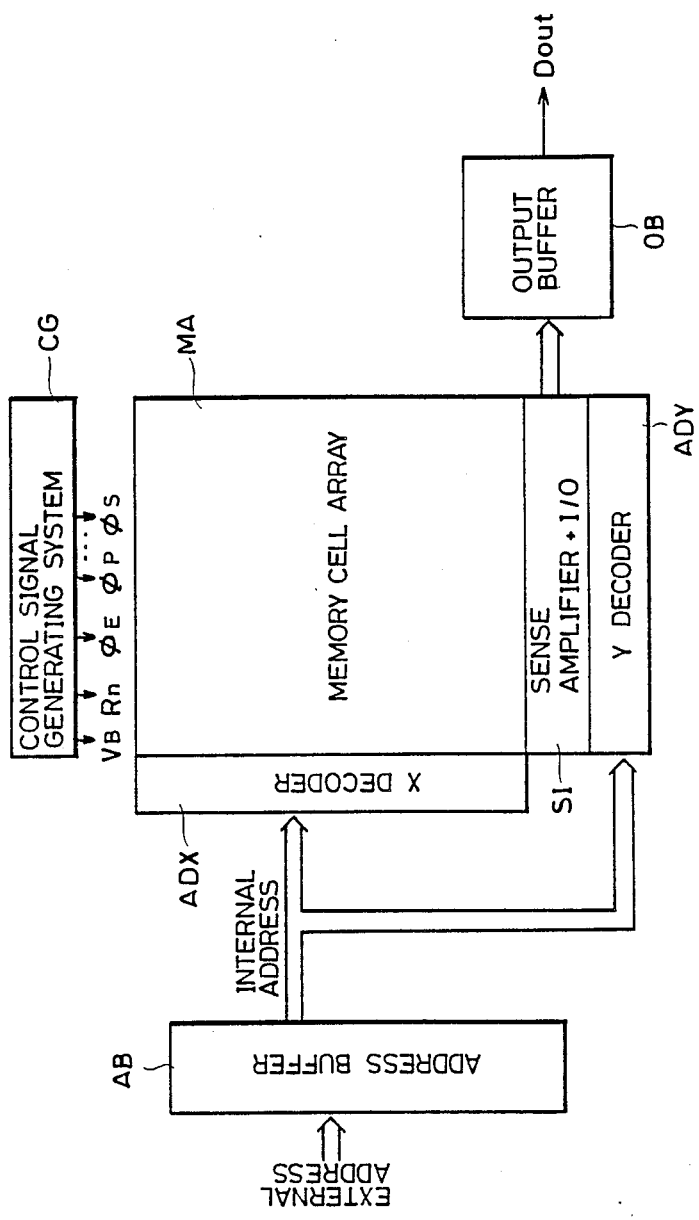
FIG. 1 is a schematic diagram of an example of an entire structure of a conventional dynamic random access memory.
Figure 2:
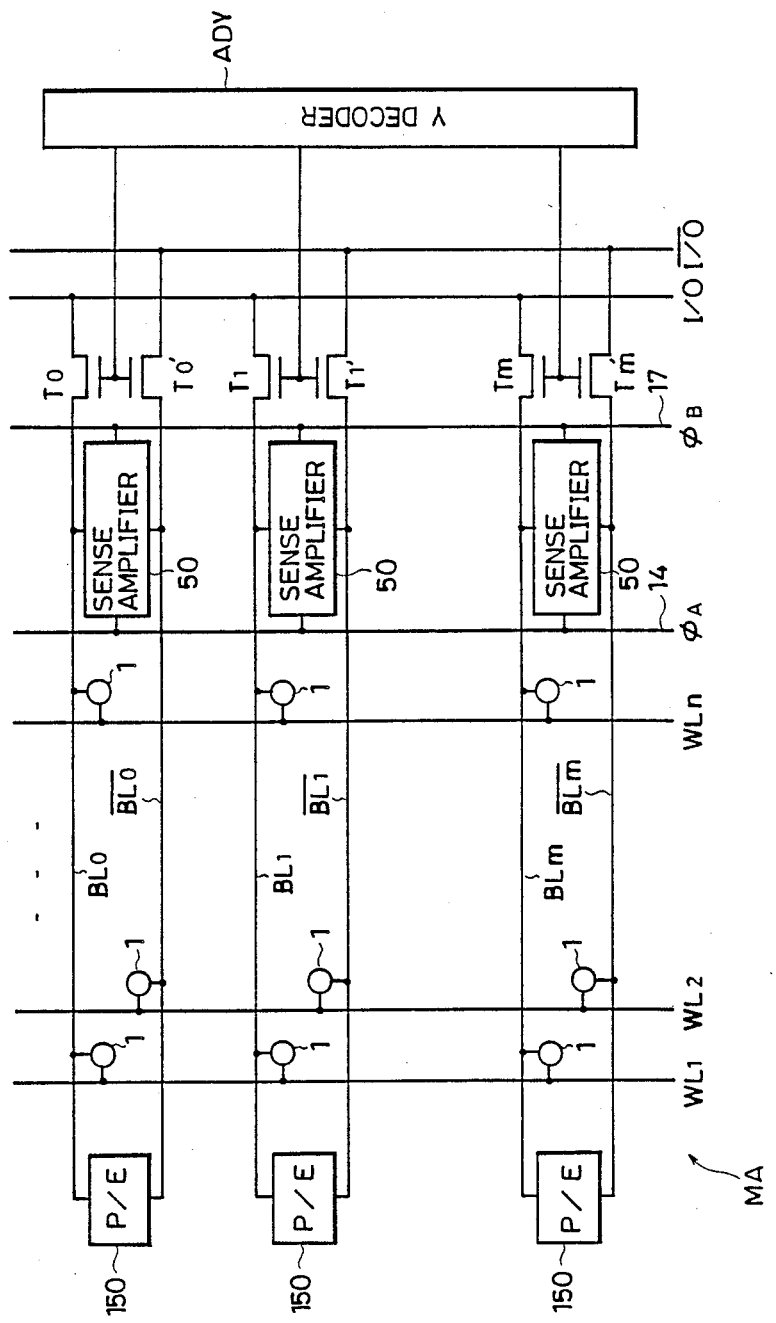
FIG. 2 is a schematic diagram showing a memory cell array portion of the dynamic random access memory shown in FIG. 1 and other circuits associated therewith.
Figure 3:
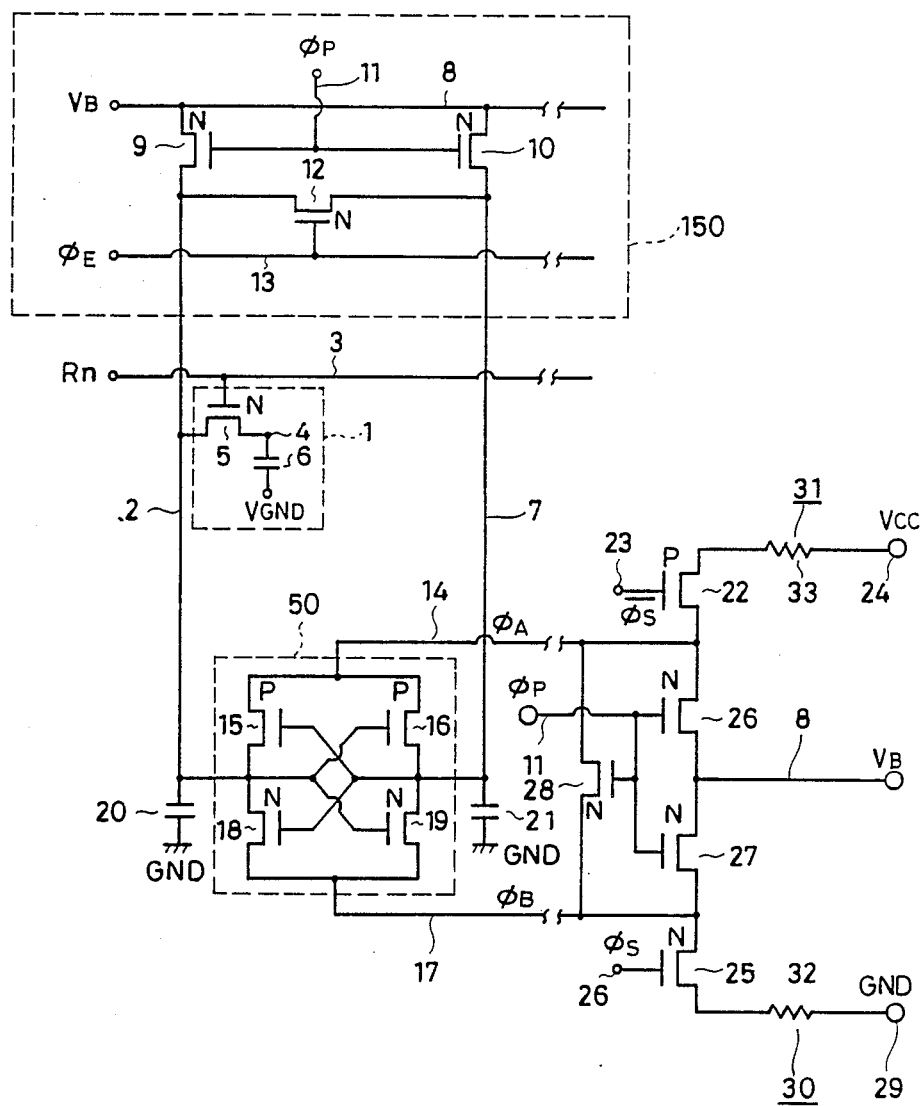
FIG. 3 is a diagram more specifically showing one pair of the bit lines shown in FIG. 2 and a circuit structure associated therewith.
Figure 4:
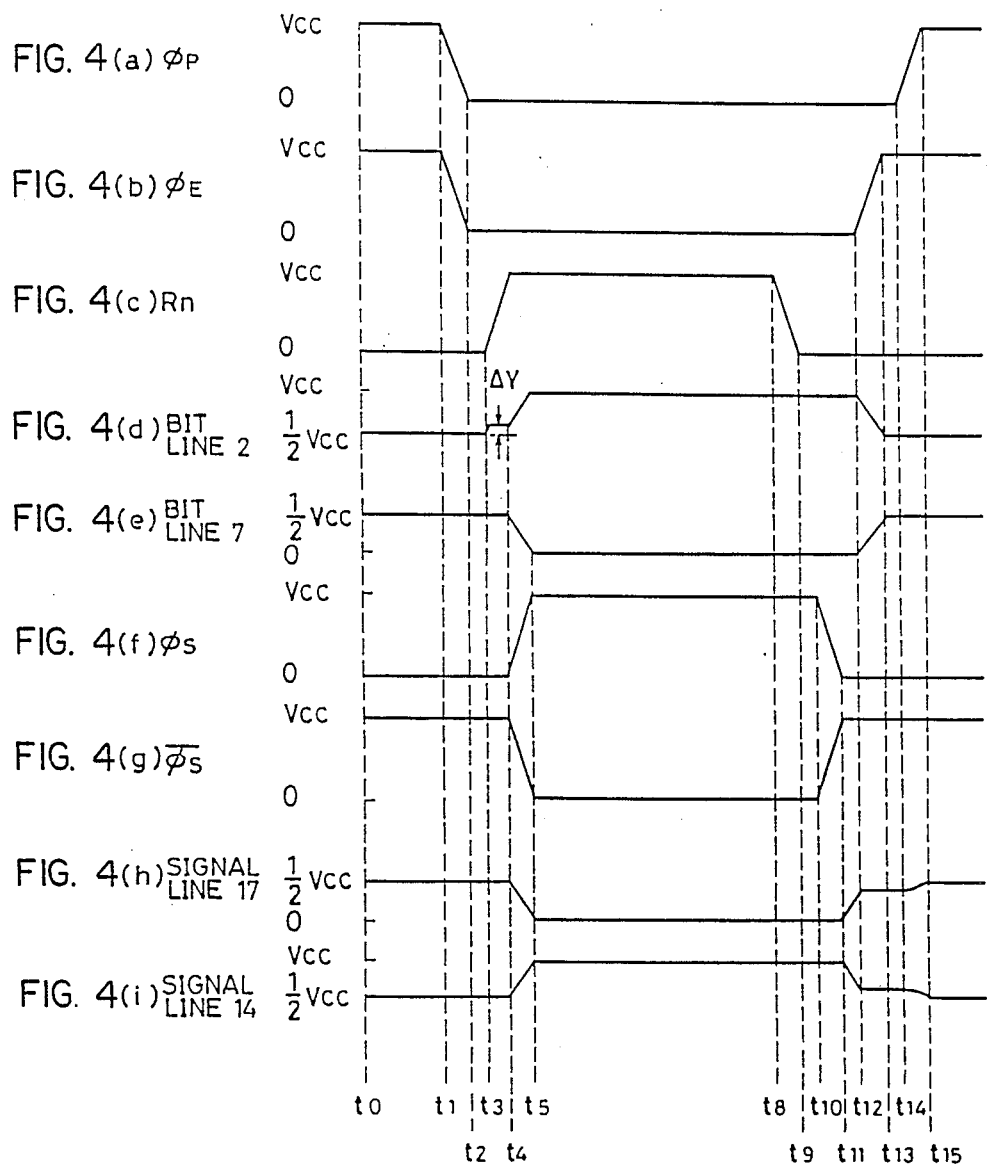
FIG. 4 is a signal waveform diagram showing an operation of the structure shown in FIG. 3, where information of logic "1" having been stored in the memory cell shown in FIG. 3 is read out.
Figure 6:
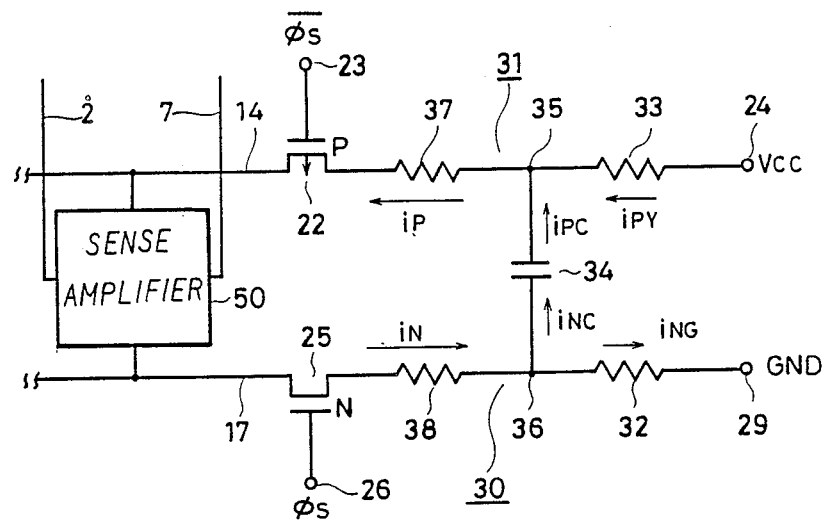
FIG. 6 is a diagram showing a major part structure of a sense amplifier driving apparatus in a semiconductor memory device according to an embodiment of the present invention.

FIG. 6 is a circuit diagram showing a structure of a sense amplifier driving apparatus according to an embodiment of the present invention, where like reference numerals and characters are given to like or corresponding parts of the conventional sense amplifier driving apparatus shown in FIG. 3. Furthermore, to avoid repeating any those descriptions unnecessary for the structure shown in FIG. 6, those parts having the same structure as shown in FIG. 3 are omitted.

Referring to FIG. 6, the sense amplifier driving apparatus according to an embodiment of the present invention comprises a capacitor 34 provided between a ground line 30 and a power line 31. The capacitor 34 has one electrode connected to a connection node 35 of the power line 31 and the other electrode connected to a connection node 36 of the ground line 30. The capacitor 34 is provided on the side of pads 24 and 29, adjoining the p-FET 22 and the n-FET 25 which activate a sense amplifier. Therefore, parasitic resistance of the ground line 30 is divided into a parasitic resistance 38 between the n-FET 25 and the connection node 36, and a parasitic resistance 32 between the connection node 36 and the ground terminal (bonding pad) 29.

Parasitic resistance of the power line 31 is divided into a parasitic resistance 37 between the p-FET 22 and the connection node 35, and a parasitic resistance 33 between the connection node 35 and the power terminal (bonding pad) 24. Since the connection nodes 35 and 36 are provided in the vicinity of the p-FET 22 and the n-FET 25, the parasitic resistances 37 and 38 are made smaller than the parasitic resistances 33 and 32, respectively. FIG. 7 is a signal waveform diagram for explaining an operation of the sense amplifier driving apparatus shown in FIG. 6, where potential changes of the sense amplifier activating signal and the signal lines 14 and 17 in the discharging operation of the sense amplifier are typically shown. Furthermore, in FIG. 7, the operation according to the present invention is shown with solid line while the operation of a conventional sense amplifier driving apparatus is shown with broken line for comparison. In the following, the operation of the sense amplifier driving apparatus according to an embodiment of the present invention will be described with reference to FIGS. 6 and 7.

When the sense amplifier activating signal $\phi_S$ rises at the time T0, the n-FET 25 is rendered conductive. This causes the signal line 17 which transmits the sense amplifier activating signal $\phi_B$ to be connected to the ground line 30 so that potential on the signal line 17 begins to fall from the precharge level of Vcc/2. As a result, the sense amplifier 50 is activated to come into an operation of amplifying minute potential difference appearing between the bit lines 2 and 7 so that potential on the bit line at a lower potential is discharged. Then, the discharge current $i_N$ from this lower-potential bit line flows through the sense amplifier 50, the signal line 17 and the n-FET 25. This discharge current $i_N$ causes voltage drop at the parasitic resistance 38 and a potential increase on the signal line 17. Since this parasitic resistance 38 is extremely small and thus its voltage drop is also negligibly small, however, it does not affect discharging of the bit line. This discharge current $i_N$ shunts into two flows at the connection node 36. One discharge current $i_{NC}$ flows toward the capacitor 34 while the other discharge current $i_{NG}$ flows toward the ground terminal (bonding pad) 29.

The discharge current $i_{NG}$ causes voltage drop at the parasitic resistance 32 so that potential at the connection node 36 is increased. However, this discharge current, which is generally large at the beginning of the sensing operation, decreases with the lapse of time. Therefore, the potential at the connection node 36 increases when the discharge current flows at the time t0 but, as the discharge current diminishes, decreases to 0 V at the time T1.

Meanwhile, as indicated by the broken line in FIG. 7, since the conventional sense amplifier activating apparatus is not provided with the capacitor 34, there exists no shunt for current toward the capacitor 34 so that a large voltage drop occurs at the parasitic resistance 32 and also a large potential increase can be seen at the connection node 36 as compared with the present invention. As a result, in the conventional case, the electrode potential of the n-FET 25 on the side of the connection node 36 does not reach the ground potential level of 0 V until the time T2. Accordingly, the voltage drop on the signal line 17 and thus the operating speed of the sense amplifier become slower as compared with the present invention.

As described above, what is necessary for attaining a higher operating speed of the sense amplifier is to reduce the potential increase at the connection node 36 to a least possible degree. For this purpose, it is necessary to make the discharge current $i_{NG}$ flowing through the parasitic resistance 32 as small as possible and make the discharge current $i_{NC}$ flowing into the capacitor 34 even larger. This can be attained by making the capacitance value of the capacitor 34 as large as possible, but in fact, limitations on the semiconductor chip area do not allow infinite increase in this capacitance value. In the following, an approximate least possible capacitance value of the capacitor 34 will be calculated which is expected to have the effects of reducing impedance by the parasitic resistance.

As previously shown by the expression (2), the discharge current $i_N$ which flows from the signal line 17 to the ground line 30 through the n-FET 25 is generated by discharging the charges having been stored in capacitance of the bit lines. Therefore, if the capacitor 34 has a capacitance value equivalent to capacitance of the entire bit lines participating in the discharging to this signal line 17, the charges can be shared between the entire bit lines participating in the discharging and the capacitor 34 so that the capacitor 34 can absorb approximately a half of the discharged charges. This allows the potential increase at the connection node 36 to reduce to a half as compared with the conventional sense amplifier driving apparatus, resulting in a fast discharging operation of the sense amplifier.

With a 4 M dynamic random access memory, for example, an area which is required for implementing the capacitance value of a level as described above on a semiconductor chip will be calculated below.

When the capacitor 34 is formed of an FET capacitor (MOS capacitor) of the same structure as that of an n-FET, the occupied area becomes minimum. The capacitance value in this case is given by the following expression, i.e.:

$$C = (\epsilon ox/Tox) \cdot S \quad (3)$$

where Tox represents film thickness of the gate insulating film of the n-FET, $\epsilon ox$ represents dielectric constant of the gate insulating film and S represents area of the gate insulating film. From the above expression (3), the area S is given by the following expression.

$$S = (Tox/\epsilon ox) \cdot C \quad (4)$$

For a general 4 mega dynamic random access memory, the following expressions are obtained.

$$Toxp = 200 \times 10^{-10} \, (m)$$

$$\epsilon ox = 4 \times 8.85 \times 10^{-12} \, (F/m)$$

Therefore, if the above value 300 pF is used as the capacitance value C, the occupied area S of the capacitor 34 is as follows.

$$S = (200 \times 10^{-10}/4 \times 8.85 \times 10^{-12}) \times 300 \times 10^{-12} \, (m^2) = 0.17 \, (mm^2)$$

Figure 5:
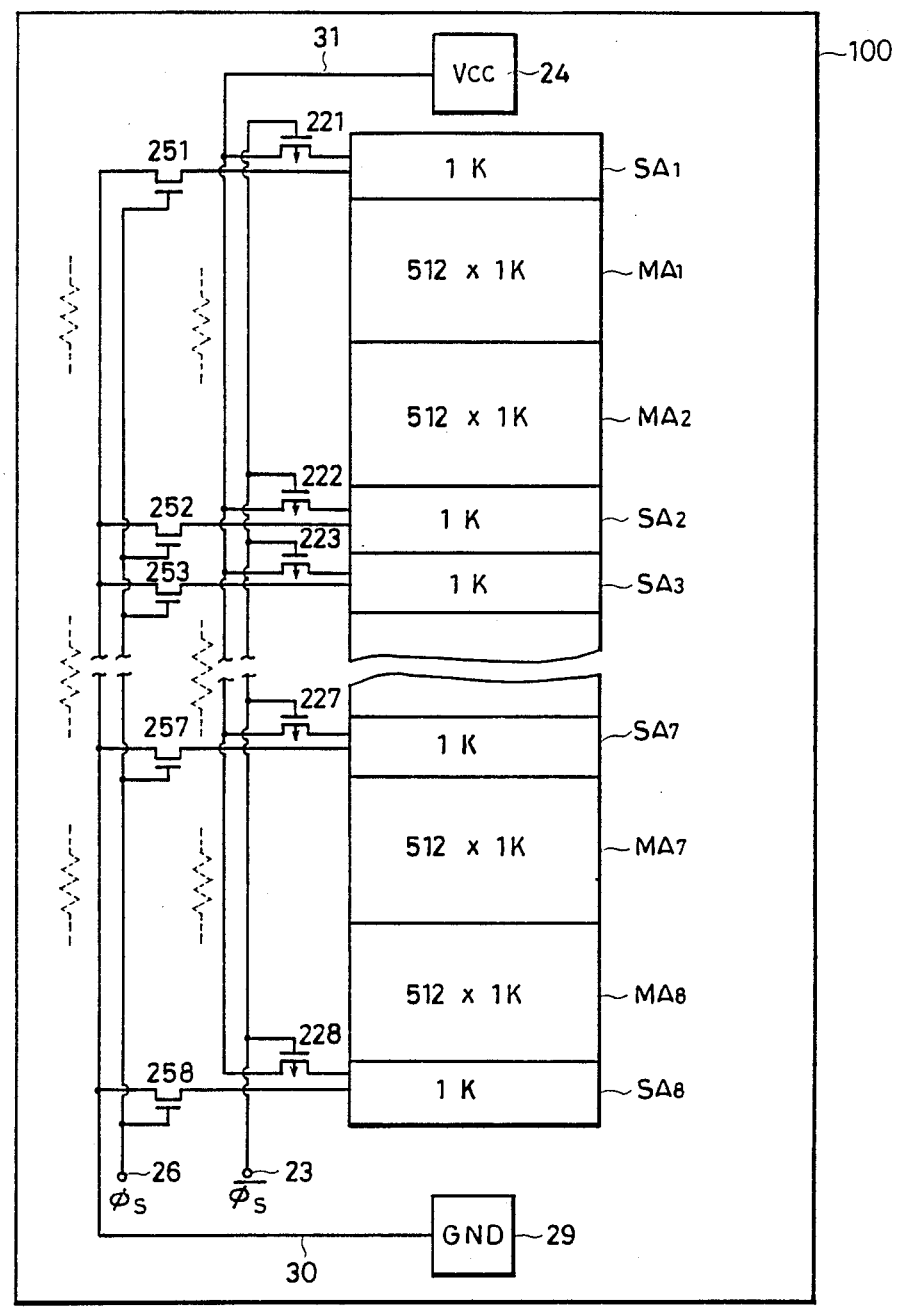
FIG. 5 is a schematic diagram showing an arrangement of a memory cell array and power supply signal lines in a mega dynamic random access memory, with the purpose of explaining problems of the conventional dynamic random access memory in operation of the sense amplifier.
Figure 9:
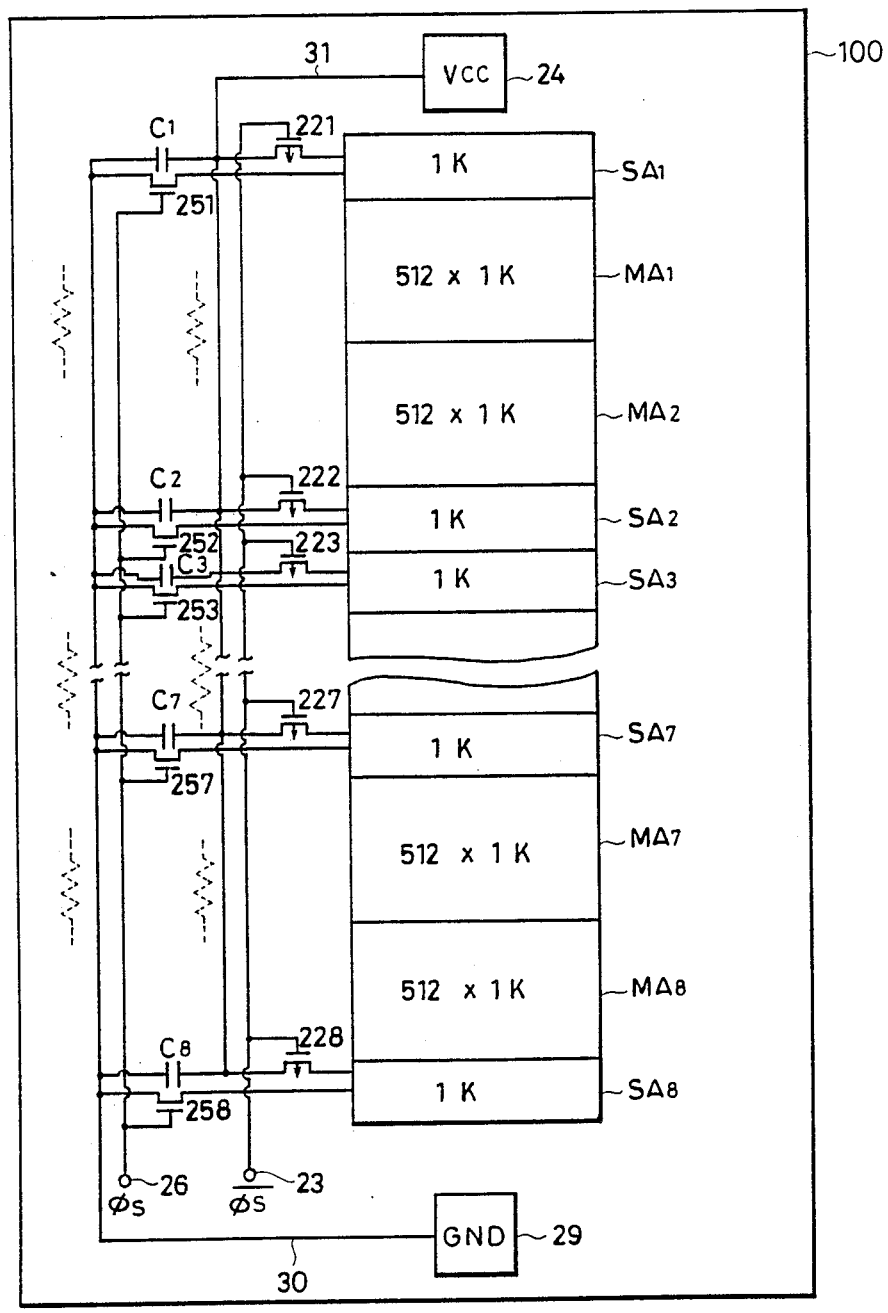
FIG. 9 is a diagram showing a schematic arrangement of a capacitor used in a sense amplifier driving apparatus according to an embodiment of the present invention.

The 4 mega dynamic random access memory cell array is generally divided into 8 sub arrays as shown in FIG. 5, so that if it is constituted to be provided with a single capacitor 34 for each of the sub blocks as shown in FIG. 9, the total occupied area will amount to $0.17 \times 8 = 1.36$ (mm$^2$). The respective capacitors which have been provided corresponding to the respective sub array blocks into have desired effects on the corresponding sub array block. The capacitors have effects also on other sub array blocks since they are commonly connected with the ground line 30 and the power line 31. These effects are so intricate that a description therefor is not made here to avoid the complexity. Briefly stated, however, contribution of a single capacitor at minimum and 4 capacitors at maximum (two sub array blocks operate simultaneously) can be expected for the respective subarray blocks. Generally, as an intermediate value between the maximum and the minimum, 2 or 3 capacitors can be expected to have effects on the respective sub array blocks.

In a general 4 mega dynamic random access memory with a chip area of about 100 mm$^2$, the above-mentioned value of 1.36 mm$^2$ occupies only 1.36% of the chip area so that there can be seen no appreciable influence on the chip area.

Furthermore, in practice, the capacitor 34 can be laid out also in such a manner that a part of it is provided under aluminum interconnections or the like which are disposed on the chip 100. Therefore, the area required for the capacitor 34 can be further diminished than the value described above.

Though the capacitance value of this capacitor 34 will have greater effects as it is increased, it is preferable to determine an appropriate value for it in consideration of the balance between the loss caused by an increased chip occupied area, and the benefit obtained through a higher-speed sense amplifier discharging operation.

While in the above, only the discharging operation of bit lines has been described for simplicity, the same effects can be obtained also for the bit line charging operation and the above description is true of the charging operation if only the direction of potential change is reversed. More specifically, in FIG. 7, the polarity of the sense amplifier activating signal $\phi_S$ and the directions of potential changes on the signal line 17 and the connection node 36 are reversed, an operational waveform diagram of the bit line charging can be obtained. In this case of the charging operation, potential on the connection node 35 decreases due to a voltage drop at the parasitic resistance 33 caused by charge current $i_{PY}$. This potential decrease at the connection node 35 is, however, compensated by charge current $i_{PC}$ from the capacitor 34 so that the ratio of the potential decrease can be reduced as compared with the conventional apparatus case and thus the potential at the connection node 35 can be increased to the supply potential level Vcc at a higher speed. Meanwhile, charge current iP flowing to the signal line 14 through the p-FET 22 in FIG. 6 is given as sum of the current $i_{PY}$ and the current $i_{PC}$.

Furthermore, when the discharging and the charging of the bit lines are performed substantially at the same time, since the change in voltage of one electrode of the capacitor 34 has a reverse phase with respect to the other, these voltages are cancelled by each other without causing any appreciable potential drop and increase at the connection nodes 35 and 36, allowing the charging and the discharging of the bit lines at an idealistically high speed.

Generally, when the charging and the discharging operations are simultaneously performed in a sense amplifier, through-current flows significantly from the operational supply potential to the ground potential, resulting in a malfunction or the like due to fluctuation in the substrate potential. For this reason, in a general memory, the times for the bit line charging and the bit line discharging are made different from each other. However, if the operational timings of the bit line charging and the bit line discharging are synchronized so as to attain a higher operating speed of the sense amplifier, the advantages of the sense amplifier driving apparatus according to the present invention can be further enhanced.

Furthermore, in the structure above, the amounts of the charge current flowing from the supply line 31 and the discharge current flowing into the ground line 30 are reduced as compared with the conventional apparatus so that the fluctuation in the supply potential Vcc and the ground potential in the sense amplifier operation becomes smaller. Therefore, the capacitor 34 serves as a DC stabilizing capacitor, preventing malfunction of the circuit caused by the fluctuation in the supply potential.

Figure 8:
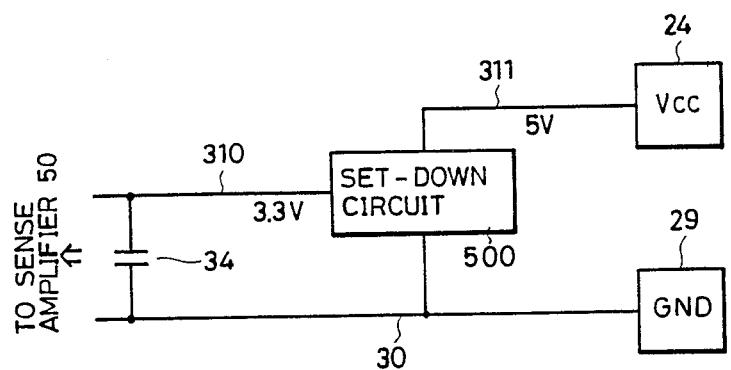
FIG. 8 is a diagram showing a major part structure of a sense amplifier driving apparatus according to another embodiment of the present invention.

FIG. 8 is a diagram showing a structure of a sense amplifier driving apparatus according to another embodiment of the present invention. As the storage capacity of a dynamic random access memory increases and its integration level is improved, there arises a problem of a reduced size of an FET formed on the memory chip which causes the break-down voltage between the source and the drain of the FET to decrease, deteriorating reliability of the memory. In order to overcome this problem, it becomes necessary to decrease the operational supply voltage of 5 V as used in the conventional memory. The supply voltage from the external, however, remains 5 V. Therefore, in order to keep the usefulness of memory even in a large-capacity one, a step-down circuit 500 may be memory provided in the internal of the memory to form a decreased internal operational supply voltage (3.3 V) while keeping the externally applied supply voltage at 5 V. In this case, as shown in FIG. 8, the capacitor 34 will be connected between an internal power line 310 from the step-down circuit 500, and the ground line 30 connected to the the ground terminal pad 29.

In the structure shown in FIG. 8, the step-down circuit 500 receives a voltage of 5 V from the supply voltage bonding pad 24 through a power line 311 and steps down the same to 3.3 V to supply an operational supply voltage to the respective circuits through the internal power line 310. This means that the internal power line 310 corresponds to the above-mentioned power line 31 and thus also in the structure of FIG. 8 the same effects can be obtained as described with reference to FIG. 6.

While in the embodiment above, the signal lines 14 and 17 are both held at the precharge voltage $V_B$ in their stand-by state, the same effects in the embodiment above can be obtained even in a sense amplifier structure having no FET provided therein for equalizing/precharging these signal lines 14 and 17.

In the following, a structure of the capacitor 34 will be specifically described. As described above, the capacitor 34 is formed of an MOS capacitor and has a sectional structure as schematically shown in FIG. 10A.

Figure 10A:
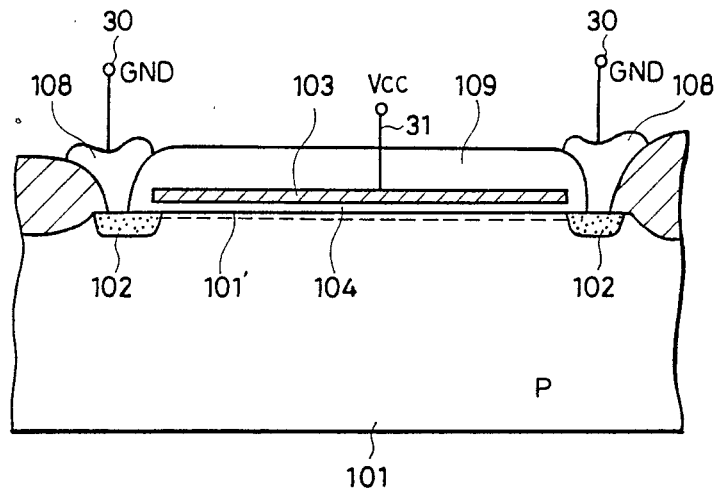
FIGS. 10A to 10C are diagrams showing a structure, a connection and an equivalent circuit, respectively, of the capacitor used in the present invention.

Referring to FIG. 10A, the MOS capacitor (34) comprises a p-type semiconductor substrate 101, an N-type impurity diffused region 102 formed in a predetermined area on the P-type semiconductor substrate 101, a gate insulating film (capacitor insulating film) 104 formed on a surface of the semiconductor substrate 101, and a gate electrode 103 formed on the gate insulating film 104. The diffused region 102 provides one electrode extraction for the capacitor (an electrode extraction to be connected to the ground potential GND, or the ground line 30 in FIG. 10A). The gate electrode 103 serves as another electrode, of the capacitor and is formed of polycrystalline silicon, high melting point metal silicides such as molybdenum silicide, tungsten silicide and the like, or a multilayer structure made up of polycrystalline silicon and a high melting point metal or a refractory metal.

The gate electrode 103 is connected to the power line 31 to be further connected to the supply potential Vcc. This power line 31 and the ground line 30 are formed of low-resistive metals such as aluminum or the like, as described above. The gate insulating film 104 is formed with the use of an insulating film of $SiO_2$ or the like. The source and drain electrode 108 is formed of a low-resistive conductor of aluminum or the like and electrically contracted with the impurity region 102 to supply it with the ground potential GND through the ground line 30.

Figure 10B:
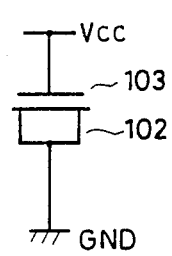

An interlayer insulating film 109 is provided to electrically insulate the electrodes 103 and 108 from each other. When the supply potential Vcc is applied to the gate electrode 103, generally, an inversion layer (N-type inversion layer) 101' is formed on a surface of the semiconductor substrate 101. This inversion layer 101' forms another electrode of the capacitor. Therefore, in the MOS capacitor shown in FIG. 10A, the inversion layer 101' is one electrode and the gate electrode 103 is the other one of the capacitor. The ground potential GND is applied to this inversion layer 101' through the impurity diffused region 102 to form ground potential GND of one electrode while the supply potential Vcc is applied to the other electrode, enabling the MOS capacitor to function. This MOS capacitor is of the same structure as that of an MOS transistor used in a memory chip except that the source and drain electrodes are commonly connected to the ground potential GND. A connection structure of this MOS capacitor is shown in FIG. 10B and an equivalent circuit thereof is shown in FIG. 10C.

Figure 10C:
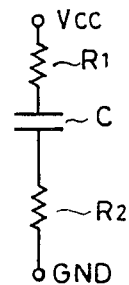

Referring to FIG. 10C, a resistance R1 represents parasitic resistance of the gate electrode 103 and a resistance R2 represents parasitic resistance of the inversion layer 101'.

Figure 11:
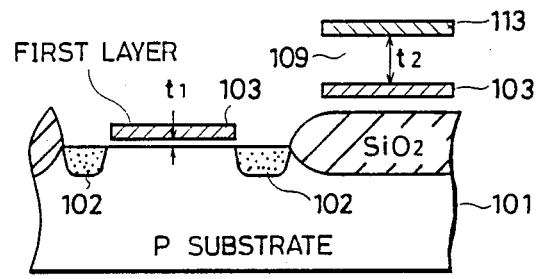
FIG. 11 is a diagram for comparing an MOS capacitor used in the present invention and a conventional capacitor.

The reason why a capacitor of such an MOS structure as described above is used is that this structure of the capacitor enables the dielectric (capacitor dielectric) to be thinned, and the occupied area to be reduced on the memory chip. More specifically, as shown in FIG. 11, when the interlayer insulating film 109 is used as the capacitor dielectric, the film thickness t2 of this dielectric 109 is about ten times that of the gate insulating film 104, or t1, and thus the capacitor will occupy an area ten times that of the MOS capacitor.

Also in a capacitor structure wherein a predetermined capacitance value is provided by etching the interlayer insulating film 109 to have a smaller film thickness, a first and a second electrode layers 103 and 113 are required for electrodes of the capacitor. This first electrode layer 103 may be formed in the same manufacturing process with the gate electrode 103 while the electrode layer 113 may be formed in the same manufacturing process with another second interconnection layer (not shown in FIG. 11). Accordingly, the film thickness t2 of the dielectric between these electrodes 103 and 113 will be equal to that of an insulating film formed between signal interconnection layers used in other portions. These internal signal interconnection layers are required to have as small interlayer capacitance as possible. This is because that if the parasitic capacitance between the internal signal interconnection layers are large, capacitive coupling between the internal signal interconnection layers may lead to fluctuation of signals and the parasitic capacitance may delay transmission of the internal signals. Therefore, when such first and second electrode layers 103 and 113 are used as electrodes of the capacitor in a chip, the film thickness t2 of this capacitor dielectric film is set to be about 5 to 10 times that of the gate insulating film 104, or t1. Such an insulating film between the signal interconnection layers is basically made large in thickness. Therefore, in order to form a capacitor of sufficient size with the use of these metal interconnection layers 103 and 113, a large occupied area is required, so that it becomes impossible to obtain a capacitor which occupies a small area and has a desired capacitance value.

On the contrary, by using a capacitor of such an MOS structure as described above, it becomes possible to obtain a capacitor which occupies a minimum area and has a maximum capacitance value. In addition, since the gate electrode 103 is made of a relatively low-resistive material as described above, its parasitic resistance R1 can take a relatively small value of several $\Omega$ to several tens $\Omega$. However, the resistance R2 (see FIG. 10C) is a resistance of the inversion layer in the MOS transistor which is generally a main component of on-resistance of the MOS transistor, so that it takes a considerably large value of several hundreds to several $K\Omega$. When the parasitic resistance R2 takes such a large value, the time constant (CR) also becomes larger as the capacitance value increases, which may make it difficult for the capacitor to quickly respond to the bit line charging and discharging operations in the sense amplifier operation as described above.

Therefore, it is preferable to use a capacitor which can respond to the bit line charging and discharging operations at a higher speed and suppress fluctuation in the supply potential (both of the Vcc and the GND) as far as possible. In the following, a structure of a capacitor superior in its high-frequency characteristic, or of an electrostatic capacitor which has a small parasitic resistance and a largest possible capacitance value will be described.

Figure 12:
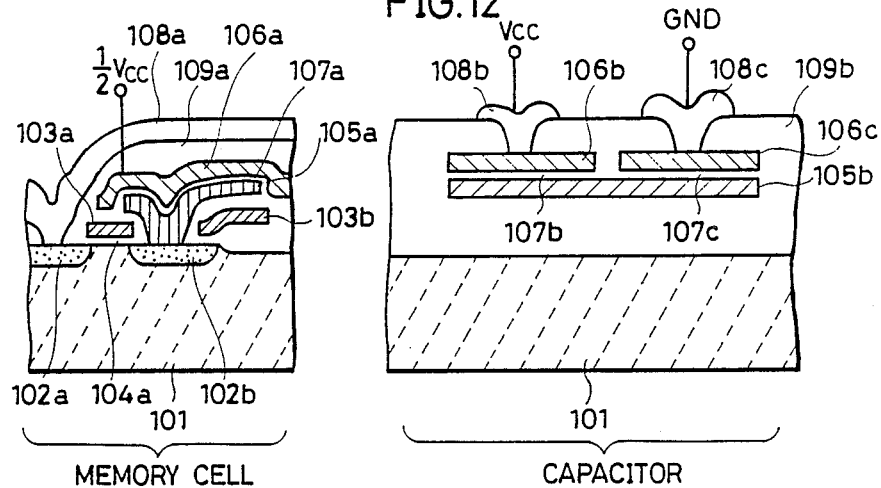
FIG. 12 is a diagram showing a structure of a capacitor according to still another embodiment of the present invention with a sectional structure of a memory cell.

In FIG. 12, a sectional view of a capacitor 34 according to still another embodiment of the present invention is shown along with a sectional structure of a dynamic random access memory. Referring to FIG. 12, a memory cell (left side portion of FIG. 12) and a DC stabilizing circuit capacitor (right side portion of FIG. 12) are formed on the same P-type semiconductor substrate 101.

The memory cell has a cell structure of one-transistor-and-one-capacitor type. The memory cell transistor comprises a semiconductor substrate 101, N-type impurity diffused regions 102a and 102b formed at predetermined surface areas of the semiconductor substrate 101, a gate insulating film 104a formed on a surface of the semiconductor substrate 101 and an electrode interconnection layer 103a formed on the gate insulating film 104a.

The impurity diffused regions 102a and 102b constitute source and drain regions of the memory cell transistor, respectively. The electrode interconnection layer 103a is formed of materials containing refractory metals, such as polycrystalline silicon, molybdenum silicide, tungsten silicide or the like, and constitutes also a part of a word line. The memory cell capacitor comprises an interconnection layer 105a which electrically contacts the impurity diffused region 102b and extends over the electrode interconnection layers 103a and 103b to be formed in a predetermined area, an insulating film formed on the electrode layer 105a, and an interconnection layer 106a formed on the insulating film 105a.

The interconnection layer 105a is formed of materials containing refractory metals, such as polycrystalline silicon, molybdenum silicide, tungsten silicide or the like, and electrically contacts the drain region 102b of the memory transistor to function as one electrode of the memory cell capacitor. The interconnection layer 106a is also formed of materials containing refractory metals, such as polycrystalline silicon, molybdenum silicide, tungsten silicide or the like, and receives a half of the operational supply voltage Vcc, or Vcc/2 to function as the other electrode of the memory cell capacitor.

The insulating films 104a and 107a are both made of materials such as $SiO_2$. The insulating film 107a is set to be of a $\frac{1}{2}$ thickness of the gate insulating film 104a. This is because that with the same dielectric break-down voltage in this case, the thinner the insulating film is, the larger the capacitance of the capacitor becomes, since the voltage applied to the gate insulating film 104a is of the Vcc level while the voltage applied to the memory cell capacitor electrode is of the Vcc/2 level at its maximum.

The source region (impurity diffused region) 102a of the memory transistor is electrically connected to a low-resistive conductive layer 108a made of aluminum, polycrystalline silicon or the like. This conductive layer 108a forms a bit line in the memory cell array. Furthermore, an interconnection layer 103b formed below the memory cell capacitor electrode layer 105a represents a word line for selecting memory cells connected to other row, and is formed of the same material in the same manufacturing process as the electrode interconnection layer 103a. The above-mentioned memory cell structure forms a so called stack-type memory cell. Now, the reason why a voltage of the Vcc/2 level rather than of the Vcc level is applied to the other electrode 106a of the memory cell capacitor in the memory cell structure above is as follows. The capacitor of the memory cell is required to occupy only a small area but ensure as large a capacitance value as possible. Therefore, the insulating film (capacitor dielectric) 106a in the memory cell capacitor portion is preferably made as thin as possible. Since such a thin insulating film is used as the capacitor dielectric, the voltage applied to the electrode layer 106a of the memory cell capacitor is set to a low value of Vcc/2 so as to ensure the dielectric break-down voltage. Meanwhile, in the memory cell capacitor structure shown in FIG. 12, there is formed an interlayer insulating film 109a between the electrode layer 106a and the conductive layer 108a of the memory cell capacitor to provide electrical insulation therebetween.

The capacitor shown in right-side portion of FIG. 12 as an embodiment of the present invention comprises an electrode layer 105b formed above a surface of the semiconductor substrate 101, insulating films 107b and 107c formed on the electrode layer 105b, electrode layers 106b and 106c formed on the insulating films 107b and 107c, and conductive layers 108b and 108c which electrically contact the electrode layers 106b and 106c, respectively. The electrode layer 105b is formed of the same material and in the same manufacturing process with respect to the memory cell capacitor electrode layer 105a. The insulating films 107b and 107c are formed of the same material to be of the same film thickness and in the same manufacturing process with respect to the insulating film 107a of the memory cell capacitor. The electrode layers 106b and 106c are formed, independently of each other, of the same material and in the same manufacturing process with respect to the electrode layer 106a of the memory cell capacitor. The conductive layers 108b and 108c are formed of low-resistive conductors such as aluminum, polycrystalline silicon or the like, as the conductive layer 108a which will serve as a bit line. The conductive layer 108b is connected to the supply potential Vcc while the conductive layer 108c is connected to the ground potential GND.

An interlayer insulating film 109b has a function to prevent any electrical contact between the conductive layers 108b and 108c, and between the electrode layers 106b and 106c, and is formed of the same material and in the same manufacturing process with respect to the interlayer insulating film 109a in the memory cell portion. Under the electrode layer 106b there is also formed an insulating film to prevent any electrical contact between the electrode layer 105b and the semiconductor substrate 101.

Figure 13:
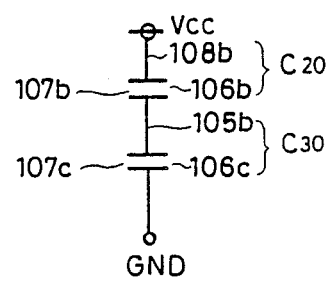
FIG. 13 is a diagram showing an equivalent circuit of the capacitor shown in FIG. 12.

FIG. 13 shows an equivalent circuit of the capacitor shown in the right side of FIG. 12. As shown in FIG. 13, the capacitor is equivalent to a structure where two capacitor elements C20 and C30 are connected in series between the supply potential Vcc and the ground potential GND. Assuming that the capacitance made up of the electrode layer 105b, the insulating layer 107b and the electrode layer 106b, and the capacitance made up of the electrode layer 105b, the insulating layer 107c and the electrode layer 106c have the same capacitance value, when the supply potential Vcc is applied to the conductor layer 108b and the ground potential GND is applied to the conductive layer 108c, the voltages applied to the respective capacitances are each Vcc/2, through division in capacitance. The voltage Vcc/2 in the respective capacitances C20 and C30 is the same as that applied across the electrodes of the memory cell capacitor, and thus an electric field equivalent to that applied to the insulating film 107a of the memory cell capacitor is applied to the insulating layers 106b and 106 of the respective capacitances C20 and C30. Therefore, in the present structure, even if the supply voltage Vcc and the ground potential GND are applied to both of the conductive layers 108b and 108c, a dielectric breakdown will not occur.

In the capacitor structure as shown in FIG. 12, in order to obtain the same capacitance value with an MOS capacitor structure, an occupied area about twice that of the MOS capacitor is required. Since the electrode layers 105b, 106b and 106c are formed of low-resistance materials, however, the parasitic resistance of the capacitor due to resistance of these electrodes can be set to a small value of several $\Omega$ to several tens $\Omega$. As a result, a capacitor superior to an MOS capacitor in its high-frequency characteristic can be obtained. In particular, since the insulating film in the present capacitor can be reduced to 1/5 to 2/5 in thickness as compared with the capacitor formed of other electrode layers as shown in FIG. 11, the occupied area can be also reduced to 1/5 to 2/5, or by 20 to 40% with respect to such a capacitor, resulting in a capacitor with a good area utilization efficiency.

Figure 14:
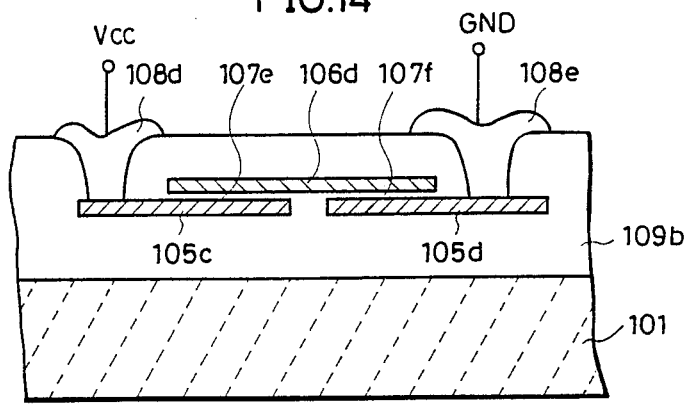
FIG. 14 is a diagram showing a sectional structure of a capacitor according to still a further embodiment of the present invention.

FIG. 14 shows a structure of another capacitor. Referring to FIG. 14, the capacitor comprises electrode layers 105c and 105d, insulating layers 107e and 107f, and the other electrode layer 106d. The electrode layer 105c is connected to the supply potential Vcc through a conductive layer 108d while the electrode layer 105d is connected to the ground potential GND through a conductive layer 108e. Also in this structure, the insulating films 107e and 107f are formed of the same material to be of the same thickness with respect to the insulating film 107a of the memory cell capacitor. The electrode layers 105c and 105d are electrically insulated from each other through an insulating film 109b. The capacitance made up of the electrode layer 105c, the insulating layer 107e and the electrode layer 106b, and the capacitance made up of the electrode layer 105d, the insulating layer 107f and the electrode layer 106d have the same capacitance value and the equivalent circuit as shown in FIG. 13. The present structure also provides the same effects as have been described with respect to the capacitor structure shown in FIG. 12.

Figure 15:
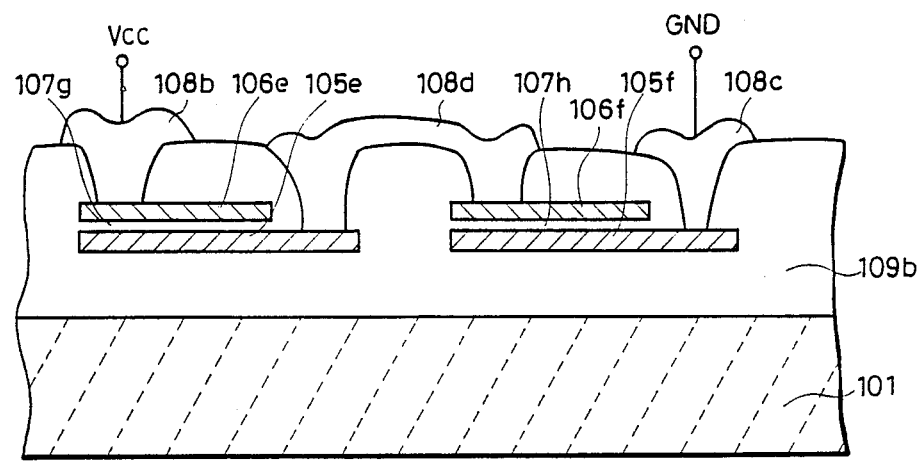
FIG. 15 is a schematic diagram showing a sectional structure of a capacitor according to a further embodiment of the present invention.

FIG. 15 is a diagram showing a capacitor structure according to still a further embodiment of the present invention. In FIG. 15, the capacitor comprises a first capacitance element made up of an electrode layer 105e, an insulating layer 107g and the other electrode layer 106e, and a second capacitance element made up of an electrode layer 105f, an insulating layer 107h and an electrode layer 106f. The electrode layer 108d. The electrode layer 106e of the first capacitance element is connected to the supply potential Vcc through a conductive layer 108b. The electrode layer 105f of the second capacitance element is connected to the ground potential GND through a conductive layer 108c. Also in this structure, the electrode layers 105e, 105f, 106e and 106f are formed of the same material and in the same manufacturing process with respect to the electrode layer of the memory cell capacitor, and the insulating layers 107g and 107h are the same in material, thickness and manufacturing process as the insulating layer of the memory capacitor. In the present structure shown in FIG. 15, the first and second capacitance elements are also connected in series between the operational supply potential Vcc and the ground potential GND, providing the same effect as has been described with respect to the above mentioned embodiments.

Figure 16:
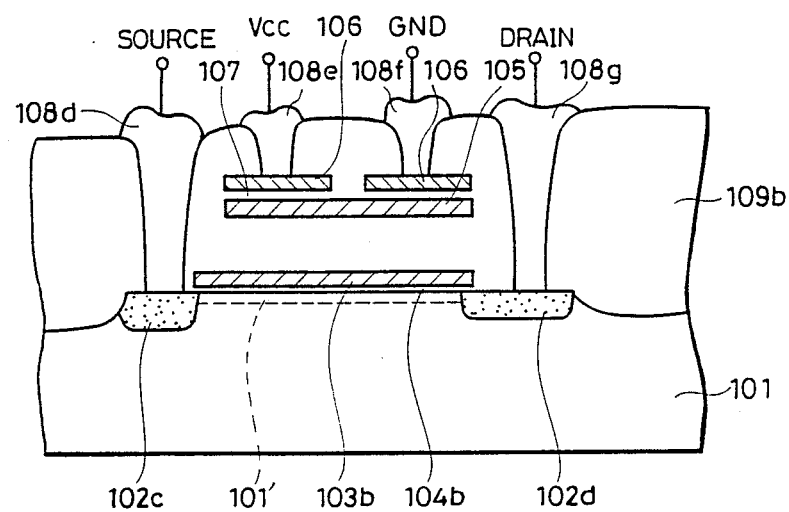
FIG. 16 is a diagram showing a schematic sectional structure of a capacitor according to another embodiment of the present invention.

FIG. 16 is a diagram showing a capacitor structure according to another embodiment of the present invention. As previously described, a capacitor according to the present invention is of the same structure as that of a stack-type memory cell capacitor, and formed on a surface of the semiconductor substrate 101 with the interlayer insulating film 109b interposed therebetween. Therefore, an MOS transistor can be formed below this capacitor (in FIG. 16, a capacitor made up of an electrode layer 105, an insulating layer 107 and an electrode layer 106). The MOS transistor is made up of impurity regions 102c and 102d, a gate insulating film 104b and a gate electrode 103b, and formed in the same manufacturing process with the memory cell transistor. If a capacitance-connection is made in the MOS transistor, or its source and drain electrodes (electrode layers 108d and 108g) are connected together and the electrode layer 103b and the electrode layers 108d and 108g are connected to the supply potential Vcc and the ground potential GND, then the overlying capacitor and the MOS capacitor are connected in parallel, resulting in a larger capacitance value with the same area and thus an improved level of the integration.

In the embodiments above, structures for performing the bit line charging and discharging at a higher speed in the sense amplifier operation has been described. However, the capacitor which has been provided for charging and discharging bit lines at a higher speed in a sense amplifier reduces the charge and discharge currents flowing into the power line 31 and the ground line 30 in the sensing operation, and suppresses fluctuation in the supply voltage Vcc and the ground voltage GND. Therefore, this capacitor can be also used as a DC voltage stabilizing capacitor.

Figure 17:
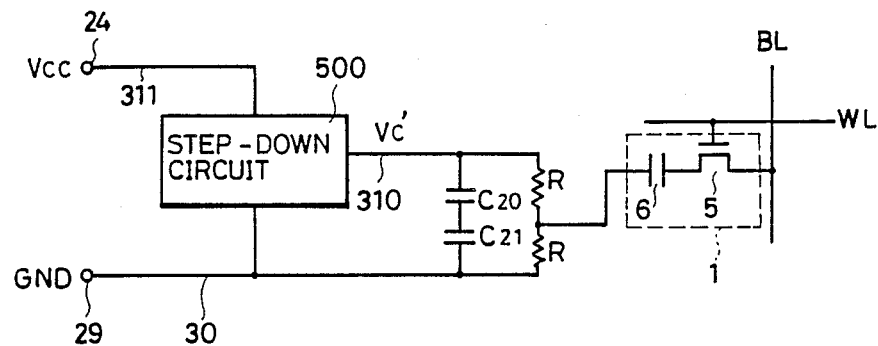
FIG. 17 is a diagram showing an application example of a capacitor according to a further embodiment of the present invention.

FIG. 17, there is shown a structure in which the capacitor is used as a DC voltage stabilizing capacitor. In the structure of FIG. 17, an example is shown where an external supply voltage Vcc is applied to a step down circuit 500 in a semiconductor chip through a supply terminal 24 and a power line 311 to be stepped down to an internal supply voltage Vc'. The external supply voltage Vcc is 5 V and assume now for example that the internal supply voltage Vc' is 3.3 V. in a memory which employs such an internal supply voltage and comprises a memory cell of a stack-type structure, Vc'/2=3.3/2=1.65 V will be applied to one electrode of a memory cell capacitor 6. This voltage to be applied to the memory cell capacitor needs to be held as stable as possible. In this case, with the use of the capacitor structure according to the present invention, the structure in which capacitance of capacitors C20 and C30 is connected between the internal power line 310 and the ground line 30 can be obtained, as shown in FIG. 17.

According to the present structure, the capacitance element comprised of the capacitors C20 and C30 has a function of stabilizing the voltage applied to the memory cell capacitor 6 also in the normal operation as well as the sense amplifier operation.

Figure 18:
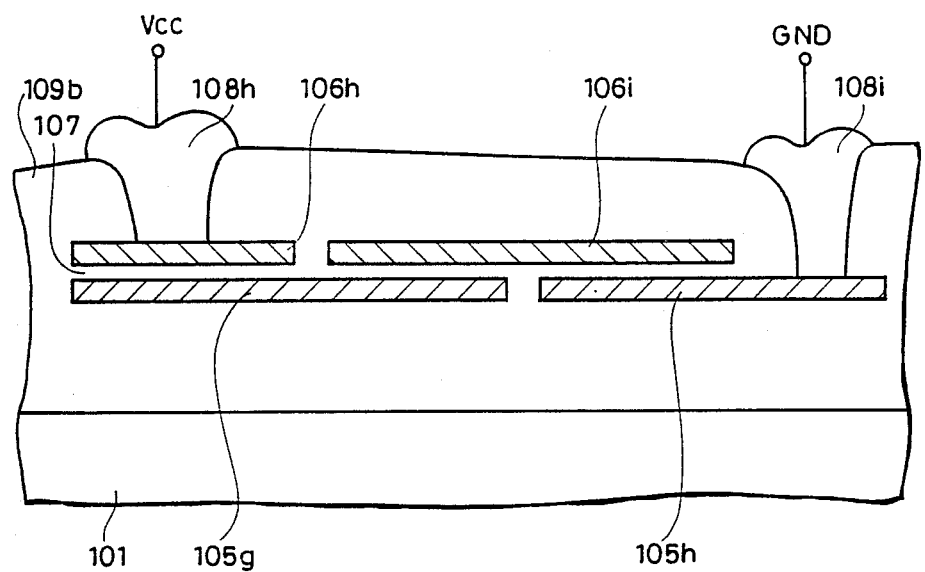
FIG. 18 is a diagram showing a structure of a capacitor according to still a further embodiment of the present invention.
Figure 19:
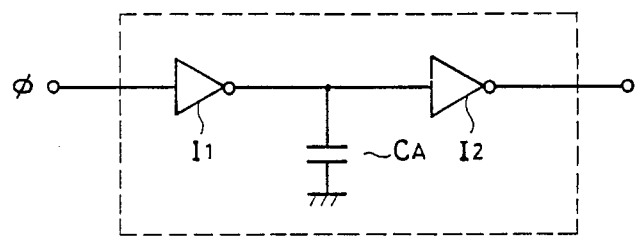
FIG. 19 is a diagram showing another application example of the capacitor according to the present invention.
Figure 20:
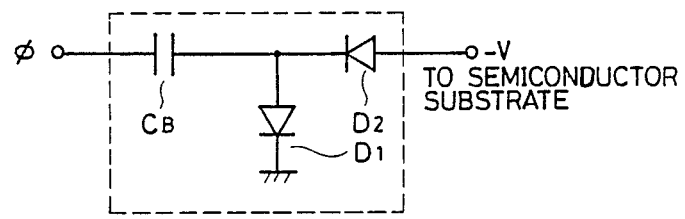
FIG. 20 is still another application example of the capacitor according to the present invention.
Figure 21:
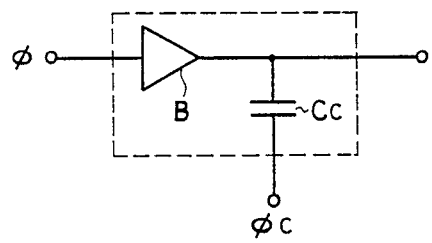
FIG. 21 is a diagram showing a further application example of the capacitor according to the present invention.

In the structure shown in FIG. 17, a voltage of Vcc/2 is applied to the memory cell capacitor 6 through division in resistance. In this case, the voltage Vcc/2 applied to the memory cell capacitor 6 is 1.65 V. Since this value amounts to about ⅓ times 5 V, the break-down voltage of the memory cell capacitor is 1.65 V. Therefore, if three capacitors are formed to be connected in series between the external supply voltage Vcc and the ground potential GND as shown in FIG. 18, stabilization of the external supply voltage Vcc is also possible. In the structure shown in FIG. 18, a first capacitor is made up of an electrode layer 105g, an insulating layer 107 and an electrode layer 106h, a second capacitor is made up of the electrode layer 105g, the insulating layer 107 and an electrode layer 106i, and a third capacitor is made up of an electrode layer 105h, the insulating layer 107 and the electrode layer 106i. These capacitors are connected in series. In the embodiment above, description has been made on a case where the capacitor is used for stabilizing the DC voltage in a memory chip. However, since the DC stabilizing capacitor according to the present invention is superior in its high-frequency characteristic, it can be also used as a capacitor in those circuits that are employed as peripheral circuits in a memory chip and utilize high-frequency signals, such as a delay circuit as shown in FIG. 19, a charge pump circuit for applying a certain substrate bias potential to a semiconductor substrate as shown in FIG. 20, a booster circuit as shown in FIG. 21 or the like. The delay circuit shown in FIG. 19 comprises two-stage inverters I1 and I2, and a delaying capacitor $C_A$ connected between output of the inverter I1 and the ground potential GND. Such a delay circuit is generally applied to those circuits that are responsive to a timing signal for delaying it by a predetermined time to generate an activating signal, such as a circuit responsive to an external $\overline{RAS}$ signal for generating a word line drive signal, a circuit for further delaying the word line drive signal by a predetermined time to generate a sense amplifier activating signal, or the like.

The charge pump circuit shown in FIG. 20 comprises a charge pumping capacitor $C_B$ which receives a clock signal on its one electrode, a diode D1 forward-connected between the other electrode of the charge pumping capacitor $C_B$ and the ground potential, and a diode D2 reversely connected between the other electrode of the charge pumping capacitor $C_B$ and a semiconductor substrate. In this charge pump circuit structure, potential on the other electrode of the charge pumping capacitor $C_B$ increases and decreases in response to the clock signal $\phi$, which is clumped by the diodes D1 and D2, respectively, so that potential of the semiconductor substrate is biased to a predetermined potential through the charge pumping operation. Since the clock signal $\phi$ in this case is a high-frequency signal, a capacitor superior in the high-frequency characteristic may preferably be used as the charge pumping capacitor $C_B$ and thus the capacitor according to the present invention can be applied therefor. In FIG. 21, there is shown a booster circuit which is used in a word line bootstrapping structure or the like for further bootstrapping a word line to ensure restoring of memory cell data, for example, in the restoring operation for rewriting after reading of the memory cell data, which comprises a buffer B for receiving a clock signal $\phi$, and a bootstrapping capacitor $C_C$ connected to output of the buffer B in parallel and responsive to a bootstrapping clock signal $\phi_C$ for bootstrapping potential on the output terminal of the buffer B.

As has been described in the foregoing, according to the present invention, a capacitor of the same structure as the memory cell capacitor is used as a capacitance element in peripheral circuits of a semiconductor memory device so that it becomes possible to obtain a capacitor which has a reduced parasitic resistance and a sufficient capacitance value as the capacitance element, occupies only a small area and is superior in the high-frequency characteristic. That capacitor can therefore attain a higher speed in charging and discharging bit lines in the sense amplifier operation, suppress fluctuation in the supply potential, stabilize the DC voltage and improve the high-frequency characteristic.

Especially when this capacitance element is used in a sense amplifier driving apparatus, it can increase the operating speed of a sense amplifier and thus the operating speed of a dynamic random access memory.

Furthermore, with the use of the capacitor according to the present invention, the current which flows toward pads as an external power terminal and for internal ground in the charging and discharging operations of the sense amplifier is decreased, so that noise on these pads and their external terminals are reduced, which enables a stabilized operation of the semiconductor memory device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A sense amplifier driving apparatus in a semiconductor memory device having a plurality of memory cells (1) arranged in a matrix of rows and columns and each comprising one field effect transistor (5) and one capacitor (6)', a plurality of bit line pairs (BL and $\overline{BL}$; 2 and 7) each having connected thereto one column of said plurality of memory cells, and a plurality of sense amplifiers (50) provided to each of said plurality of bit line pairs to detect and differentially amplify potential on the corresponding bit line pair, comprising:
    a first signal line (14) coupled to each of said plurality of sense amplifiers for transmitting a first sense amplifier driving signal ($\phi_A$);
    a second signal line (17) coupled to each of said plurality of sense amplifiers for transmitting a second sense amplifier driving signal ($\phi_B$);
    a first power line (31) for transmitting a first supply potential;
    a second power line (30) for transmitting a second supply potential;
    a first switching means (22) provided between said first signal line and said first power line to be responsive to a first sense amplifier activating timing signal ($\phi_S$) for connecting said first signal line with said first power line;
    a second switching means (25) provided between said second signal line and said second power line to be responsive to a second sense amplifier activating timing signal for connecting said second signal line with said second power line; and capacitance means (34) having one electrode connected to said first power line and the other electrode connected to said second power line, and comprising at least one capacitance element (C; C20, C30), said capacitance element having an electrode (106, 105) and a dielectric (107) which are made of the same materials as those of said capacitor (6) comprised in said memory cell, and the dielectric (107b to 107h) of said capacitance element having the same film thickness as that of a dielectric (107a) of the capacitor comprised in said memory cell.

2. The driving apparatus according to claim 1, wherein
said capacitance means comprises the capacitance element which is provided in a position as near as possible to said first and second switching means.

3. The driving apparatus according to claim 1, wherein
said capacitance element of said capacitance means comprises an MOS capacitor structure.

4. The driving apparatus according to claim 1, wherein
said memory cell capacitor has a stack structure in which both of the two electrodes are formed on a semiconductor substrate together, and said capacitance means comprises at least two capacitance elements connected in series, these capacitance elements being manufactured in the same process as that of said memory cell capacitor.

5. A sense amplifier driving method in a semiconductor memory device having a plurality of memory cells arranged in a matrix of rows and columns and each storing information, a plurality of bit line pairs each having connected thereto one column of said plurality of memory cells and transmitting data having been held in selected memory cells, and a plurality of sense amplifiers provided to each of said plurality of bit line pairs to amplify potential difference on the corresponding bit line pair, comprising the steps of:
activating said sense amplifiers, said activating step comprising the steps of electrically connecting a first signal line (14) with a first power line (31), and electrically connecting a second signal line (17) with a second power line (30), said first signal line and said first power line charging one bit line of said respective bit line pairs through said sense amplifiers, and said second signal line and said second power line discharging the other bit line of said respective bit line pairs through said sense amplifiers; and reducing current flowing into said second power line by shunting current flowing from said second signal line to said second power line with the use of a capacitor provided between said first power line and said second power line to be connected to both of them, and making current from said second power line and current from said capacitor merged into one to be transmitted to said first signal line.

6. The method according to claim 5, wherein
said activating step comprises a step of simultaneously making electrical connections between said first signal line and said first power line, and said second signal line and said second power line.

7. A capacitance means (34; C) used in a semiconductor memory device having a plurality of memory cells (1) each comprising one switching transistor (5) and one capacitor (6), comprising:
an electrode (103; 106 and 107) made of the same material as an electrode comprised in said memory cell capacitor (6); and
a dielectric layer (104; 107) being the same in material and film thickness as a dielectric layer comprised in said memory cell capacitor (6).

8. The capacitance means according to claim 7, wherein
said memory cell capacitor has an MOS structure having one electrode formed of a conductive layer and the other electrode formed of a semiconductor layer, and said capacitance means further comprises a capacitor (101', 102, 103, 104) of an MOS structure formed in the same manufacturing process with said memory cell capacitor.

9. The capacitance means according to claim 7, wherein
said memory cell capacitor has a stack structure having one and the other electrodes formed of conductive layers which have been formed on a semiconductor substrate together, and said capacitance means comprises at least two capacitance elements (C20, C30; C; 105, 106 and 107) connected in series and each having been formed in the same process with said memory cell capacitor.

* * * * *